United States Patent [19]

Bobb

[11] Patent Number: 4,524,322
[45] Date of Patent: Jun. 18, 1985

[54] FIBER OPTIC SYSTEM FOR MEASURING ELECTRIC FIELDS

[75] Inventor: Lloyd C. Bobb, Willow Grove, Pa.

[73] Assignee: The United States of America as represented by the Secretary of the Navy, Washington, D.C.

[21] Appl. No.: 442,497

[22] Filed: Nov. 18, 1982

[51] Int. Cl.³ .................. G01R 31/02; G01R 31/00
[52] U.S. Cl. ........................... 324/72; 324/96; 324/458; 350/356
[58] Field of Search ............ 324/96, 457, 458, 72; 350/355, 356, 374; 356/33

[56] References Cited

U.S. PATENT DOCUMENTS

| | | | |
|---|---|---|---|
| 3,344,344 | 9/1967 | Wales, Jr. ............ | 324/458 |
| 3,645,603 | 2/1972 | Smith ................. | 350/371 |
| 3,781,092 | 12/1973 | Sussman et al. ........ | 324/96 |
| 3,827,000 | 7/1974 | Matsushita et al. ..... | 332/7.51 |
| 3,920,982 | 11/1975 | Harris ................ | 455/606 |
| 4,002,896 | 1/1977 | Davies et al. ......... | 455/610 |
| 4,059,759 | 11/1977 | Harney et al. ......... | 350/377 |
| 4,070,620 | 1/1978 | Feldtkeller et al. .... | 324/96 |
| 4,070,622 | 1/1978 | Harms et al. .......... | 324/96 |
| 4,161,651 | 7/1979 | Sano et al. ........... | 324/96 |
| 4,255,018 | 3/1981 | Ulrich et al. ......... | 350/375 |
| 4,442,350 | 4/1984 | Rashleigh ............. | 324/96 |

OTHER PUBLICATIONS

Giallorenzi et al.; "Optical Fiber Sensor Technology"; IEEE Journal of Quantum Electronics; vol. QE-18; No. 4; Apr. 1982; pp. 656-658.
Cahill et al.; "Passive Homodyne Demodulators"; Proceedings of the Tri-Service Workshop on Fiber-Optic Sensors and Guided Wave Technology; Fort Eustis, Va.; Oct. 5-8, 1982; pp. 181-182.

Primary Examiner—Ernest F. Karlsen
Attorney, Agent, or Firm—Robert F. Beers; Henry Hansen; Armand M. Vozzo, Jr.

[57] ABSTRACT

A fiber optic sensor system and associated technique is disclosed for measuring an electric field wherein a sensor arm of optical fiber cable is wound about a core member of piezoelectric material. A reference arm of optical fiber cable substantially equal in optical path length to the sensor arm is isolated and connected in parallel to the sensor arm so that coherent light generated by a single mode laser source may be split through the fiber-optic arms and recombined after passage therethrough for phase comparison. When subjected to a local electric field, the core member of piezoelectric material varies in dimensions and thereby causes a change in the strain in the optical fiber cable of the sensor arm. Relative phase changes in the coherent light caused by the resulting optical path length change of the strained sensor arm are detected by a passive homodyne demodulator and determinative of the value of the local electric field. A vane-type shield is adapted to be rotated about the core member for periodically reducing the local electric field to near zero thereby providing a reference level for field measurement.

14 Claims, 1 Drawing Figure

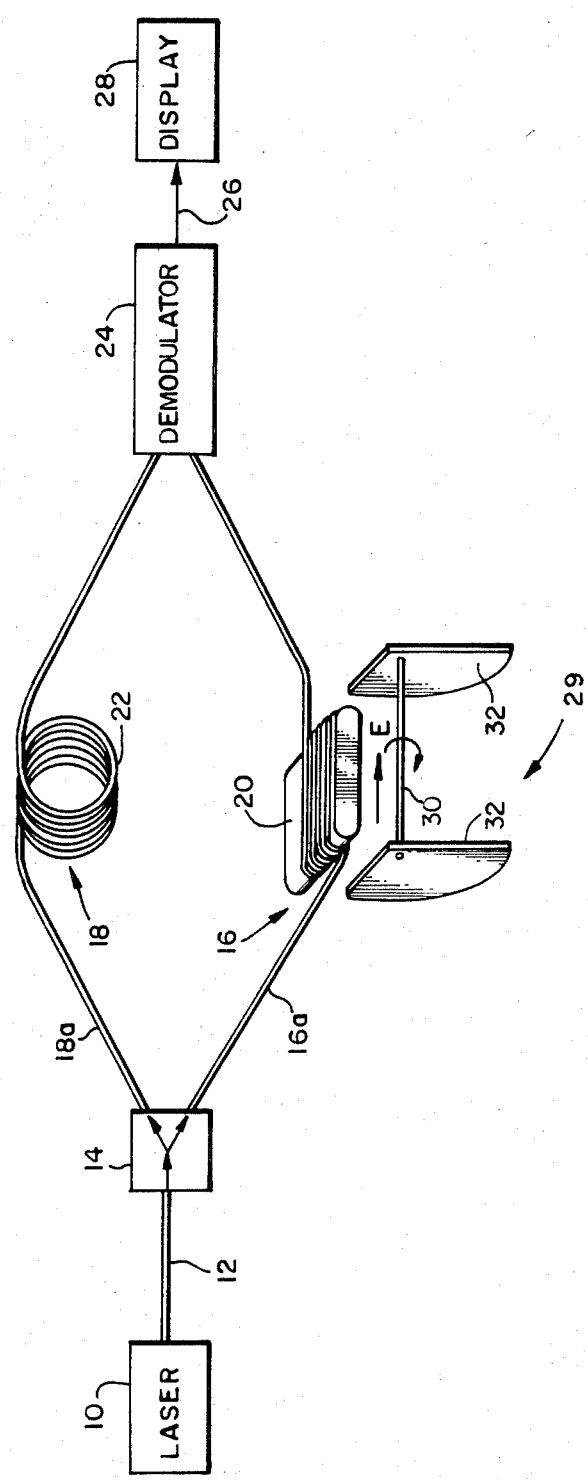

FIBER OPTIC SYSTEM FOR MEASURING ELECTRIC FIELDS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to the detection and measurement of electric fields and more particularly to an improved fiber optic sensor system and associated technique wherein an optical fiber wrapped about a piezoelectric core is used for accurately detecting a measurable electric field.

In the measurement of an electric field environment, various electrical sensors have been employed to detect the presence and nature of an electric field. Many of these electrical sensors include the use of a pair of metal electrodes connected to an electrometer to measure a voltage therebetween. With the electrode separation being known, the electric field is equal to the measured voltage divided by the separation distance. Another common electrical sensor used in electric field detection and measurement includes a parallel plate capacitor which varies in capacitance value with time. A measure of the charge flowing into and out of the capacitor yields the associated voltage and thereby the electric field.

While these and other existing electrical sensors have generally been satisfactory in measuring the presence of most electric fields in an environment, they have not been entirely effective in accurately detecting relatively small fields due to limitations in their sensitivity and reliability. Firstly, all such electrical sensors are subject to noise pick-up in the cables leading to and from the sensors. Secondly, the intermetallic connections that exist in these sensors, particularly in the metal electrode type, act as thermocouple junctions to generate seemingly negligible currents and potentials that can cause significant errors in the measurement of small electric fields. Furthermore, these electrode-type sensors have not been capable of providing accurate and reliable measurements of electric fields in an ocean environment due to erroneous electro-potentials generated by the metal electrodes when immersed in sea water.

SUMMARY OF THE INVENTION

Accordingly, it is a general purpose and object of the present invention or provide an improved sensor system and associated technique for accurately detecting a measurable electric field in an environment.

Another object of the present invention is to provide an electric-field responsive system having increased sensitivity but less prone to erroneous electro-potentials to permit accurate measurement of relatively small electric fields.

Still another object of the present invention is to provide an electric field sensor that can effectively operate in remote environments including the ocean.

A further object of the present invention is to provide an electric field sensor system that is highly reliable, amenable to miniaturization, and compatible with existing field-sensing applications.

Briefly, these and other objects of the present invention are accomplished by a fiber optic sensor system and associated technique for measuring electric fields wherein a sensor arm of optical fiber cable is wound about a core member of piezoelectric material. A reference arm of optical fiber cable substantially equal in optical path length to the sensor arm is connected in parallel to the sensor arm so that coherent light generated by a single mode laser source may be split through the fiber-optic arms and recombined after passage therethrough for phase comparison. When subjected to an electric field, the core member of piezoelectric material varies in dimensions and thereby causes changes in the strain in the optical fiber cable of the sensor arm. Relative phase changes in the coherent light caused by the resulting optical path length change of the strained sensor arm are detected by a passive homodyne demodulator and determinative of the local electric field. A vane-type shield is adapted to be rotated about the core member for periodically reducing the local electric field to near zero thereby providing a reference level for field measurement. The sensor arm may alternatively comprise an optical fiber cable fabricated from a piezoelectric material, such as quartz, or a conventional optical fiber jacketed with a piezoelectric coating.

For a better understanding of these and other aspects of the present invention, reference may be made to the following detailed description taken in conjunction with the accompanying drawing in which like reference numerals designate like parts throughout the figures thereof.

BRIEF DESCRIPTION OF THE DRAWING

The drawing FIGURE is a schematic illustration of a preferred embodiment of the fiber optic sensor system used to measure an electric field in accordance with the present invention.

DESCRIPTION OF THE PREFERRED EMBODIMENT

Referring now to the drawing FIGURE, there is shown the fiber optical sensor system of the present invention including a single mode laser source 10, such as a laser diode, for generating coherent light radiation having a narrow optical frequency. Projected from laser source 10, the coherent light radiation is focused into one end of a single mode optical fiber cable 12 optically compatible with the laser source. The optical fiber cable 12 is fabricated from a conventional fiber-optic material, such as silica. A beam splitter 14 of the type normally used to couple light between separate optical fibers is connected to receive the coherent light radiation at the opposite end of optical fiber cable 12 for splitting the radiation into two equal beams of light.

In accordance with the present invention, one beam of light is directed into a fiber-optic reference arm 18 comprising a length of optical fiber cable 18a similar in fabrication to cable 12. The reference arm 18 may typically have a loop arrangement 22 formed approximately at the middle of the length of optical fiber cable 18a and should be isolated to reduce its sensitivity to environmental perturbations. The other beam of light emanating from beam splitter 14 is directed into a fiber-optic sensor arm 16. The sensor arm 16 comprises an optical fiber cable 16a similar in fabrication and having substantially the same length as cable 18a so that the optical path length of the sensor arm 16 is substantially the same as that of reference arm 18. The optical fiber cable 16a of fiber-optic sensor arm 16 is wrapped snugly around a core member 20 composed of a piezoelectric crystal material capable of changing its dimensions in the presence of an electric field in accordance with the converse piezoelectric effect. One suitable piezoelectric crystal material for use as core member 20 is lead zirconate titanate. The core member 20 is poled by means of conventional technique to align its microstructure and increase its sensitivity to an electric field in a particular direction. It is preferred that, in conjunction with its poled microstructure, core member 20 is formed in the shape of a flattened elliptic cylinder elongated in the plane of the ellipse parallel to the local electric field E being measured, as indicated by the arrow in the drawing FIGURE, so that the field-induced dimensional changes in the piezo-electric material are maximized.

It should be understood that the dimensional changes in the piezoelectric material of core member 20 result in changes in the strain in the optical fiber cable 16a wrapped around the core member. Such changes in the strain of optical fiber cable 16a affect both its index of refraction (n) and length (L), and further cause corresponding changes in the optical path length (nL) of the fiber-optic sensor arm 16. Accordingly, since the total optical phase change of coherent light propagating in an optical fiber depends on the change in the optical path length of the fiber, the phase of the coherent beam of light exiting sensor arm 16 is altered by the dimensional changes in the piezoelectric core member 20 induced by the local electric field E, and when compared with the phase of the beam exiting reference arm 18, is indicative of the measure of the field.

The coherent light beams from the fiber-optic sensor and reference arms, 16 and 18 respectively, are introduced into a passive homodyne demodulator 24 wherein the beams are recombined to determine the relative phase change of the light induced by the electric field. The demodulator 24 is a conventional device (see Giallorenzi et al., "Optical Fiber Sensor Technology", *IEEE Journal of Quantum Electronics,* Vol. QE-18, No. 4, April 1982, pp. 657-658; see also Cahill et al., "Passive Homodyne Demodulators", *Proceedings of the Tri-Service Workshop on Fiber-Optic Sensors and Guided Wave Technology,* Fort Eustis, VA, Oct. 5-8, 1982, (sponsored by the U.S. Navy's Fiber Optic Sensor Systems Program) pp. 181-182), which includes photodetecting elements (not shown) at its input, for producing an output signal 26 the level of which is indicative of the phase change of the recombined light. It should be noted that the passive homodyne demodulator 24 is employed to facilitate determination of the field-induced phase change by insuring maintenance of a quadrature relationship ($\pi/2$ phase delay) between the input light beams. An electronic display device 28, such as a digital voltmeter, is connected to receive the output signal 26 from demodulator 24 to provide a visual indication of the value of the measured electric field.

A rotatable vane-type shield 29 positioned adjacent to the core member 20 of sensor arm 16 is employed in the present fiber-optic sensor system to periodically reduce the local electric field to near-zero and thereby provide a reference level for field measurement. Shield 29 includes a pair of plate members 32 fabricated from a high conductivity metal, such as copper, and coupled by an intermediate axial member 30 so that the plate members rotate concomitantly upon the axial member in substantially parallel planes about core member 20. The axial member 30 is fabricated from a high conductivity metal similar to that of plate members 32 for additionally serving to electrically connect the plate members and thereby maintain them at substantially the same potential. Adequately spaced apart to permit their parallel planes of rotation to pass closely along either side of core member 20, the plate members 32 are formed having sufficient size and shape to well contain the elongated profile of the core member, when rotated into interposed alignment therewith, so that complete shielding of the core member is effected as to the local field E. As a preferred example of their size and shape, the drawing FIGURE shows the plate members 32 configured as quarter-circular sectors adapted for rotation along axial member 30 substantially about the respective circular centers of the sectors. It should be noted that in addition to providing a periodic zero-reference for electric field measurement in accordance with the present fiber-optic sensor system, shield 29 serves to offset drifts in the system due to the electronics, and temperature and pressure changes.

Therefore, it is apparent that the disclosed invention provides an improved fiber-optic sensor system and associated technique for accurately detecting a measurable electric field in an environment. More particularly, the disclosed fiber-optic sensor system provides increased sensitivity to local electric fields but is less prone to erroneous electro-potential than existing electric field sensors. The disclosed invention also provides an electric field sensor that can effectively operate in remote environments including the ocean. Furthermore, the disclosed fiber-optic sensor system is highly reliable, amenable to miniaturization, and compatible with existing electric field sensing applications.

Other embodiments and modifications of the present invention may readily come to those of ordinary skill in the art having the benefit of the teachings presented in the foregoing description and drawing. For example, as an alternative to the use of the piezoelectric core member 20 in fiber-optic sensor arm 16, the single mode optical fiber cable 16a may be jacketed with a plastic type of piezoelectric material, such as polyvinylidene fluoride ($PVF_2$), conventionally drawn over the cable and subsequently poled by the application of an electric field at a material temperature of over 100° C. In such an alternate embodiment, the sensor arm would preferably comprise a flat coil of the jacketed optical fiber cable positioned so that changes in the value of the local electric field normal to the coil plane would vary the strain in the optical fiber and similarly affect the phase of the light beam propagated therethrough. A further alternative embodiment is to fabricate the optical fiber cable 16a entirely from a piezoelectric material, such as quartz, for producing the optical phase changes in the coherent light through the sensor arm indicative of the local electric field. Therefore, it is to be understood that the present invention is not to be limited to such teachings presented, and that such further embodiments and modifications are intended to be included within the scope of the appended claims.

What is claimed is:

1. A system for measuring an electric field, comprising:

a source of coherent light having a narrow optical frequency;

means optically connected to said source for splitting the coherent light into a pair of substantially equal beams;

first fiber-optic means optically connected to said beam splitting means for propagating one of said beams through an isolated environment via a first optical path length;

second fiber-optic means optically connected to said beam splitting means for propagating the other of said beams through the electric field via a second optical path length modulated piezoelectrically;

shield means rotatably disposed adjacent to said second fiber-optic means for periodically reducing the electric field to near-zero in the immediate proximity thereof; and interferometric detector means optically connected to receive said beams from said first and second fiber-optic means for combining said beams while maintaining a quadrature relaionship therebetween;

whereby deviations from the quadrature relationship are indicative of the phase change, relative to said first fiber-optic means, in said second fiber-optics means induced piezoelectrically by and determinative of the value of the electric field.

2. An electric field measurement system according to claim 1, wherein said second fiber-optic means comprises:
a core member of a piezoelectric material; and
a length of optical fiber cable wrapped snugly about said core member.

3. An electric field measurement system according to claim 2, wherein:
said core member is poled and formed in the shape of a flattened elliptic cylinder elongated in the plane of the ellipse.

4. An electric field measurement system according to claim 3, wherein said piezoelectric material is lead zirconate titanate.

5. An electric field measurement system according to claim 2, wherein said shield means comprises:
a pair of plate members fabricated from a high conductivity metal and parallely disposed about said core member; and
an axial member of high conductivity metal interconnected between said plate members to provide rotation thereof.

6. An electric field measurement system according to claim 5,
wherein said first fiber-optic means comprises:
a length of optical fiber cable substantially the same as the length of optical fiber cable of said second fiber-optic means.

7. An electric field measurement system according to claim 5, wherein said detector means comprises:
a passive homodyne demodulator coupled to the lengths of optical fiber cables for recombining said beams and producing an output signal indicative of the relative phase change of the recombined beams.

8. An electric field measurement system according to claim 7, further comprising:
display means connected to receive the output signal from said demodulator for visually indicating the value of the electric field.

9. An electric field measurement system according to claim 8, wherein:
said source of coherent light is a single-mode laser diode.

10. An electric field measurement system according to claim 1, wherein said second fiber-optic means comprises:
a length of optical fiber cable; and
a coating of a piezoelectric material of a plastic type intimately drawn over said length of optical fiber cable.

11. An electric field measurement system according to claim 10, wherein said first fiber-optic means comprises:
a length of optical fiber cable substantially the same as said length of optical fiber cable of said second fiber-optic means.

12. An electric field measurement system according to claim 11, further comprising:
display means connected to said detector means for visually indicating the value of the electric field.

13. An electric field measurement system according to claim 1, wherein said second fiber-optic means comprises:
a length of optical fiber cable fabricated from a piezoelectric material.

14. An electric field measurement system according to claim 13, further comprising:
display means connected to said detector means for visually indicating the value of the electric field.

* * * * *